(12) United States Patent
Negishi et al.

(10) Patent No.: US 7,372,582 B2
(45) Date of Patent: May 13, 2008

(54) METHOD FOR FABRICATION SEMICONDUCTOR DEVICE

(75) Inventors: Nobuyuki Negishi, Kodaira (JP);
Kenetsu Yokogawa, Tsurugashima (JP);
Masaru Izawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 124 days.

(21) Appl. No.: 10/531,700

(22) PCT Filed: Oct. 18, 2002

(86) PCT No.: PCT/JP02/10844

§ 371 (c)(1),
(2), (4) Date: Nov. 9, 2005

(87) PCT Pub. No.: WO2004/036638

PCT Pub. Date: Apr. 29, 2004

(65) Prior Publication Data

US 2006/0141795 A1   Jun. 29, 2006

(51) Int. Cl.
*G01B 11/14* (2006.01)
(52) U.S. Cl. ...................... 356/625; 356/626
(58) Field of Classification Search .................. None
See application file for complete search history.

(56) References Cited

U.S. PATENT DOCUMENTS 4,615,620 A * 10/1986 Noguchi et al. ............ 356/626
4,744,660 A * 5/1988 Noguchi et al. ............ 356/511
5,792,376 A * 8/1998 Kanai et al. ................. 216/71
6,268,293 B1 * 7/2001 Clevenger et al. .......... 438/706

FOREIGN PATENT DOCUMENTS

| JP | 6-177219 | 6/1994 |
| JP | 2000-131028 | 5/2000 |
| JP | 2001-284323 | 10/2001 |
| JP | 2002-93870 | 3/2002 |

* cited by examiner

*Primary Examiner*—Duy-Vu N Deo
(74) *Attorney, Agent, or Firm*—Antonelli, Terry, Stout & Kraus, LLP.

(57) ABSTRACT

The object of this invention is to provide a method for fabricating a semiconductor device in which the yield and productivity are improved. In the method for fabricating a semiconductor device according to the invention, a plasma etching system is prepared which includes a vacuum chamber 1, a susceptor 7 arranged in the vacuum chamber 1 to place a wafer 8, a gas introducing means 2 to introduce the material gas into the vacuum chamber and a high-frequency power introducing means 6. The gas introduced into the vacuum chamber by the gas introducing means 2 is converted into a plasma by the high-frequency power, and a plurality of holes are selectively formed in the oxide film 23 of a main wafer surface in a plasma atmosphere. In the hole forming step, light 15 having a continuous spectrum is irradiated on a flat portion and a hole portion of the main surface of the semiconductor wafer thereby to measure the reflectivity change in the flat portion and the hole portion.

13 Claims, 9 Drawing Sheets

METHOD FOR FABRICATION SEMICONDUCTOR DEVICE

TECHNICAL FIELD

The present invention relates to the field of the semiconductor technique, or in particular to a method of fabricating a semiconductor device including the step of forming contact holes of an interlayer insulating film.

BACKGROUND ART

The process of fabricating a semiconductor device includes the step of forming contact holes by dry etching using plasma in an interlayer insulating film (an insulating film containing silicon oxide as a main component) formed on the main surface of the wafer and filling a semiconductor or metal in the contact holes. In forming the contact holes, it is indispensable for an improved yield of the semiconductor device to fully open without any etch stop before exposure of the surface of the base semiconductor region or the underlying wiring. In view of the ever decreasing size of the contact hole and the resulting increase in the difficulty of etching, it is very important for executing a desired etching process to grasp the progress of the etching process or especially the etching depth accurately and reflect it in the processing conditions.

The situation in which the etching to form the contact holes is stopped midway and the underlying semiconductor region or the base wiring is not exposed is called an opening failure. In the prior art, in order to suppress the yield reduction due to the opening failure, it has been the practice to specify the cause of a defect by observing the cross section under SEM (scanning electron microscope) or inspecting the opening failure by the potential contrast method.

In the conventional method, however, a sample for the inspection device such as SEM is required to be prepared by actually sampling out a wafer from the lot. This requires a non-product wafer on the one hand and consumes the time of feedback to the fabrication process on the other hand, thereby reducing the productivity. Incidentally, the non-product wafer is defined as a wafer not directly contributing to the fabrication of a semiconductor device.

Now that the hole diameter has been decreased to almost less than 100 nm, the light in the wavelength range of ultraviolet to visible light hardly enters the pattern bottom without the effect of the pattern boundary, and the interference waveform measurement method using the light path length difference between the upper part and the bottom of the pattern cannot acquire a sufficiently practicable signal-to-noise ratio (S/N).

As disclosed in JP-A-2000-131028 and JP-A-2001-284323, a means available to monitor the etching depth of the contact hole in real time is a method to determine the etching depth from the interference waveform due to the difference of the light path length between the upper part and the bottom of the pattern.

DISCLOSURE OF THE INVENTION

The object of this invention is to provide a method for fabricating a semiconductor device capable of improving the yield and the productivity.

Representative aspects of the invention disclosed in this application are briefly explained below.

According to this invention, there is provided a method for fabricating a semiconductor device by preparing a plasma etching system including a vacuum chamber, a susceptor arranged in the vacuum chamber to mount a semiconductor wafer, a gas introducing means for introducing a material gas to the vacuum chamber and a high-frequency power introducing means, the method comprising the step of converting to a plasma the gas introduced into the vacuum chamber by the gas introducing means and forming a plurality of holes selectively on a main surface of the semiconductor wafer in the plasma atmosphere, comprising the steps of irradiating light having a continuous spectrum on a flat portion and a hole portion of the main surface of the semiconductor wafer and measuring the change in reflectivity of the flat portion and the hole portion, in or after the step of forming the holes.

According to this invention, in the etching process, the optical characteristics are measured in simple way so that the etching condition or especially the etching depth of each contact hole is monitored in nondestructive way thereby to make possible the early lot stop and the feedback to the processing conditions. As a result, the productivity is improved even for the logic products typically like DRAM (dynamic random access memory) requiring the volume production of scant items or the scant production of multiple items.

BEST MODE FOR CARRYING OUT THE INVENTION

This invention is explained in more detail with reference to the accompanying drawings.

EMBODIMENT 1

Figure 1:
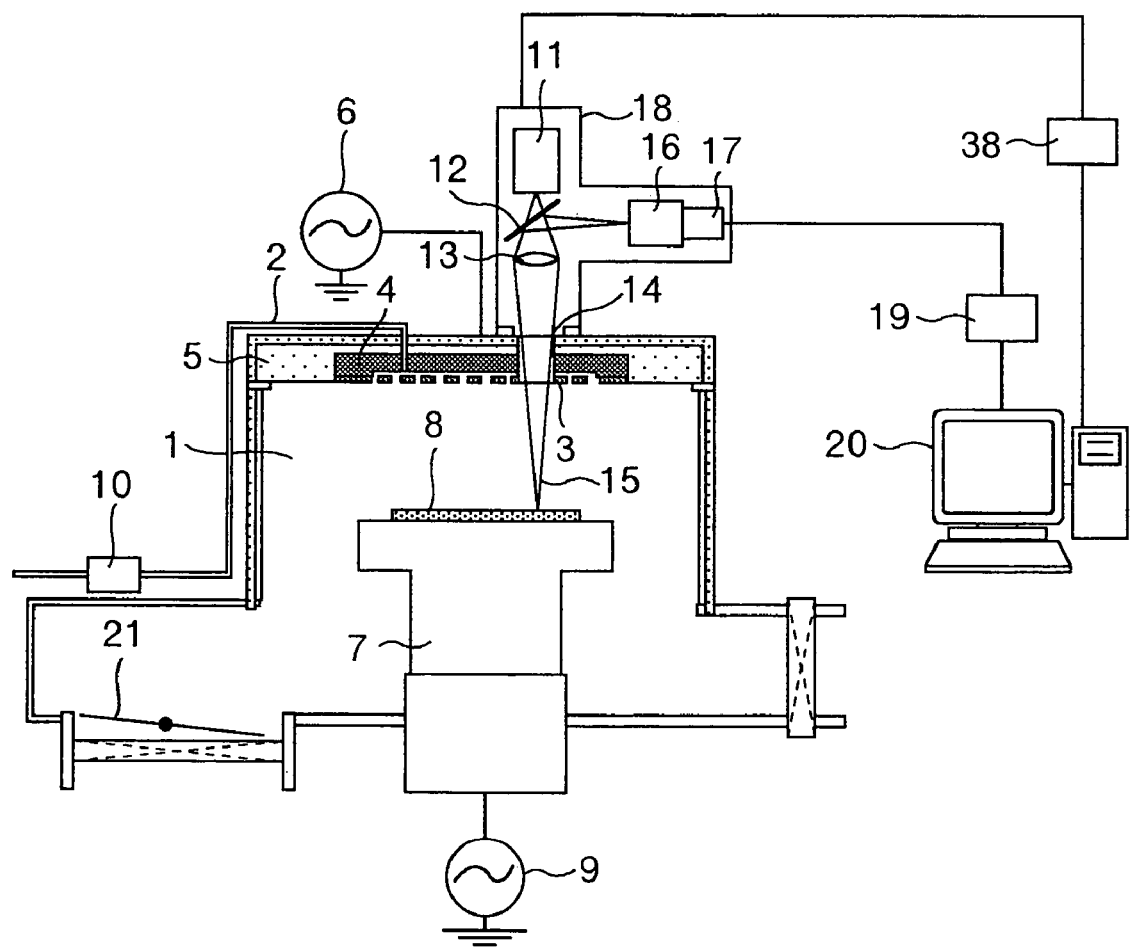
FIG. 1 is a schematic diagram showing a dry etching device having the etching depth inspection function used in a first embodiment of the invention.

A configuration of a dry etching device with the etching depth inspection function used in an embodiment of the invention is shown in FIG. 1. With this etching device, a material gas is introduced into a vacuum chamber through a gas introduction pipe 2 and a shower plate 3, and a plasma is formed by the high-frequency electric field generated by a high-frequency power supply 6. The internal pressure of the vacuum chamber 1 (etching processing chamber) is reduced by a vacuum exhaust means (not shown) of high exhaustion capacity such as a turbo-molecular pump and regulated by a conductance valve 21. The vacuum chamber 1 contains a lower electrode 7, on which a semiconductor wafer 8 is placed. The semiconductor wafer 8 is formed of, for example, single crystal silicon (Si), which contains therein a shallow-grooved isolation region and a semiconductor region (active region) defined by the shallow-grooved isolation region. The main surface of the semiconductor wafer 8 is formed with an insulating layer (interlayer insulating film) of silicon dioxide (specifically, a TEOS film). The lower electrode 7 is connected with a high-frequency bias power supply 9. The frequency of the high-frequency bias power supply 9 is 400 kHz to 1.56 MHz, or preferably, 800 kHz. The interior of the vacuum chamber 1 is maintained in a pressure-reduced environment, and ions in the plasma are drawn in by the Vpp (peak-to-peak) voltage of about 0.5 kV to 2 kV generated in the lower electrode 7 by the high-frequency bias power supply 9 thereby to etch the insulating film.

Next, the etching depth inspection function (the etching depth measuring unit) built in the etching device is described in detail.

The etching depth measuring unit according to this embodiment is arranged above the vacuum chamber 1. Specifically, the ceiling of the vacuum chamber 1 has a quartz window 14 to introduce detection light 15. White light (continuous spectrum of 350 nm or more) enters the quartz window from a Xe lamp 11 as the detection light through a lens 13. A component of the detection light is radiated on the wafer 8, and the reflected light is reflected on a beam splitter through the same light path and enters a detection system. The other components of the detection light are led directly to the detection system through a beam splitter 12 as reference light. The detection system is configured of a spectrometer 16 and a diode array 17 to instantaneously measure the wavelength distribution of the intensity of the incident light and the reflected light. The lens 13 is arranged on a vertically movable stage (not shown) to focus the light on the wafer 8. These component parts of the etching depth instrument unit are arranged on an XY movable table 18 movable horizontally. The XY movable table 18 is connected electrically to a computer 20 through a D/A converter 38. The computer 20 is also electrically connected to the diode array 17 through an A/D converter 19.

This embodiment includes a light source, an optical system and a detection system as a set to measure the flat portion and the hole portion in real time. In order to improve the inspection throughput, however, two sets of the light source, the optical system and the detection system may be provided, one used for measuring the hole portion and the other for measuring the flat portion.

Figure 2:
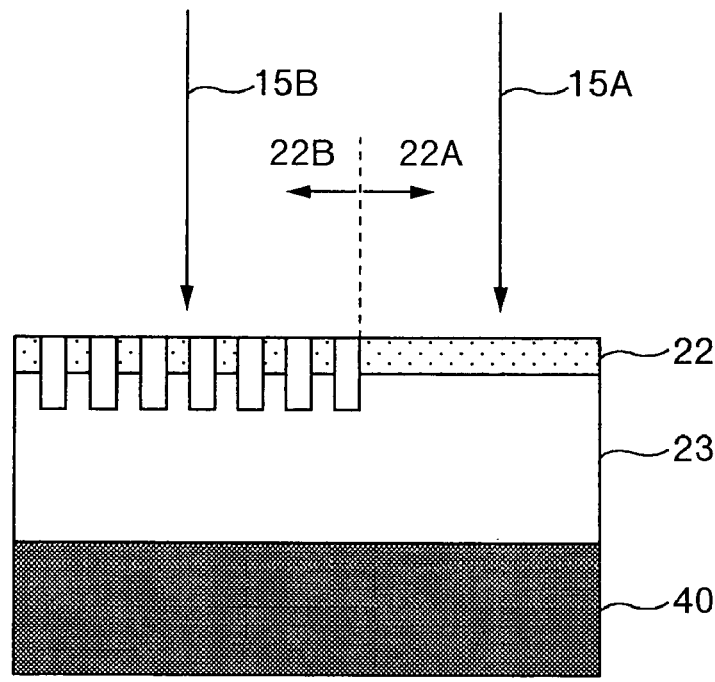
FIG. 2 is a partial sectional view of a wafer according to the first embodiment of the invention.
Figure 3:
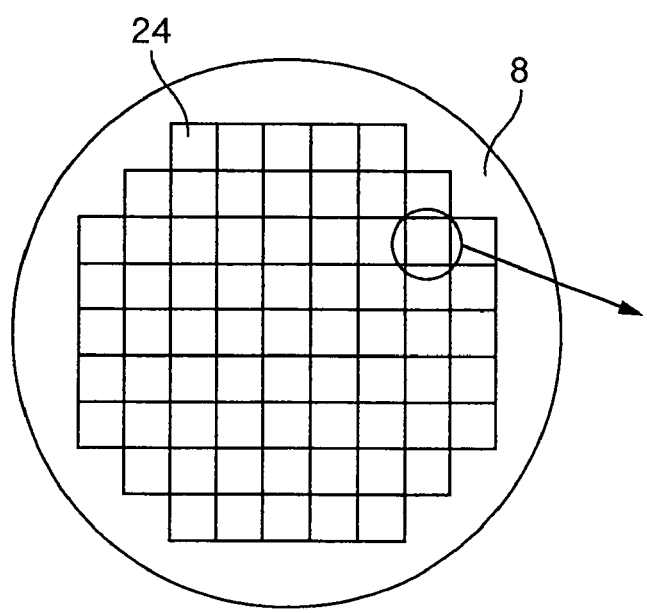
FIG. 3 is a plan view of a wafer according to the first embodiment of the invention.
Figure 4:
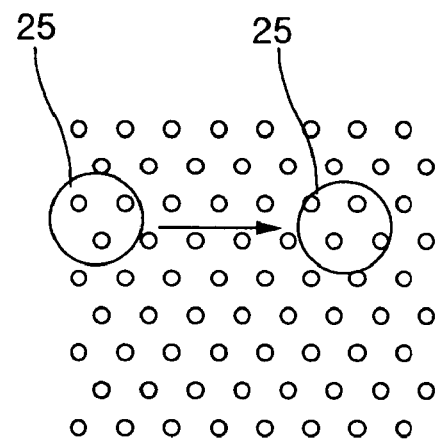
FIG. 4 is a diagram for explaining the scanning process at the detection light radiation position according to the first embodiment of the invention.

A measuring method using the etching depth measuring unit configured as described above is explained below with reference to FIGS. 1 to 5. FIG. 2 is a partial sectional view of a wafer in the state in which an oxide film 23 is deposited on the wafer (Si substrate 40) and a photo pattern is transferred to the oxide film 23 using a resist mask 22 having a plurality of holes to form contact holes. As shown in FIG. 2, a resist mask 22 formed on the oxide film 23 (insulating film) includes a portion having a plurality of hole patterns and a flat portion not formed with the hole pattern. FIG. 3 is a plan view of a wafer formed with hole patterns. The patterns 24 making up an IC chip are arranged in a grid on the main surface of the wafer 8. A hole pattern (a plurality of holes) is formed in each chip pattern 24. FIG. 4 is a plan view showing a part of the interior of the chip pattern in which hole patterns are clustered.

First, in FIG. 1, the position of the flat portion not formed with the hole patterns is specified from the computer 20 supplied with the data of the wafer patterns 24 shown in FIG. 3, and the position of the detection light for measuring the flat portion is determined by the XY movable table 18. The detection light 15 is radiated at the measurement position on the wafer 8 from the Xe lamp 11 through the lens 13. Specifically, as shown in FIG. 2, detection light 15A enters at right angles or diagonally with a predetermined angle to a flat portion 22A not formed with any hole pattern. In the process, the vertically movable stage is moved vertically to focus the light at the measurement position on the wafer. Using the spectrometer 16 and the diode array 17, the wavelength dependency of the reflectivity providing the ratio of intensity between the incident light and the reflected light is measured, and stored as a reference data in the computer 20. In measuring the flat portion, interference occurs due to the phase shift between the light reflected on the surface of the resist mask 22 and the light reflected on the boundary between the resist 22 and the oxide film 23.

Next, the actual measurement position is output from the computer 20, the XY movable table 18 is driven and the position of the detection light is provisionally determined. Like in the flat portion, the detection light 15 is radiated at the measurement position on the wafer from the Xe lamp through a lens. Also, the vertically movable table is moved vertically to focus the light at the measurement position on the wafer. Specifically, as shown in FIG. 2, detection light 15B enters a hole portion 22B formed with the hole patterns. In the process, the light enters the hole portion 22B on the same conditions as when the light enters the flat portion 22A. Specifically, as long as the light enters the flat portion 22A at right angles thereto, so does the light enter the hole portion 22B at right angles thereto.

As shown in FIG. 4, the XY movable table is scanned and the wavelength dependency of the reflectivity of the detection light is measured at each point. The amount of wavelength shift with respect to the interference peak position of the reference data already acquired is calculated, and the XY movable table is fixed at the position associated with the maximum shift. Through this process, even with a pattern having a large pitch of the hole portion like a logic product, a predetermined maximum number of holes can be always accommodated in a detection light radiation area 25 for each wafer, and therefore the measurement accuracy can be improved.

Figure 5:
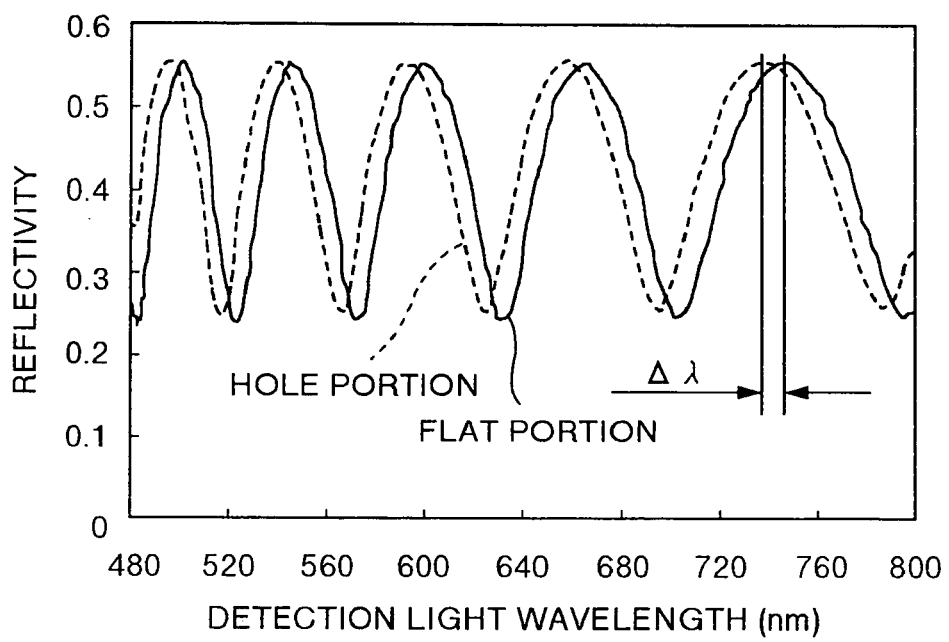
FIG. 5 is a characteristic diagram showing the wavelength dependency of the reflectivity of the flat portions and the hole portion and the wavelength shift amount of the interference peak according to the first embodiment of the invention.

According to this embodiment, the wavelength of the detection light is set to at least twice the hole diameter of the subject to be measured, and therefore the hole portion is considered to become progressively porous with the advance of etching, resulting in the wavelength shift of the interference peak as shown in FIG. 5. The amount of shift Δλ of the interference peak with respect to the reference data represents the volume change of the measurement area.

Assuming that the thickness of the oxide film and the resist film of the hole portion is equal to that of the flat portion and the hole diameter is calculated from the pattern data, then the volume change amount is converted to the etching depth. Of the steps described above, the steps other than the step of determining the measurement position of the flat and hole portions are repeated during the etching operation. Thus, the etching depth can be measured in real time.

Next, the method of calculating the resist selectivity is explained. The reference data on the wavelength dependency of the reflectivity at the flat portion acquired already is compared with the theoretical curve data calculated based on the multiple reflection interference model using the thickness of the oxide film having a wafer thickness structure stored in advance. In this way, the prevailing resist film thickness can be calculated. The difference with the initial film thickness constitutes the reduced resist amount at the particular time point. On the other hand, as already explained, the etching depth at the hole portion is determined from the wavelength shift amount of the interference peak position with respect to the reference data, and therefore, the resist selectivity can be determined by dividing the etching depth by the reduced resist amount.

Figure 6:
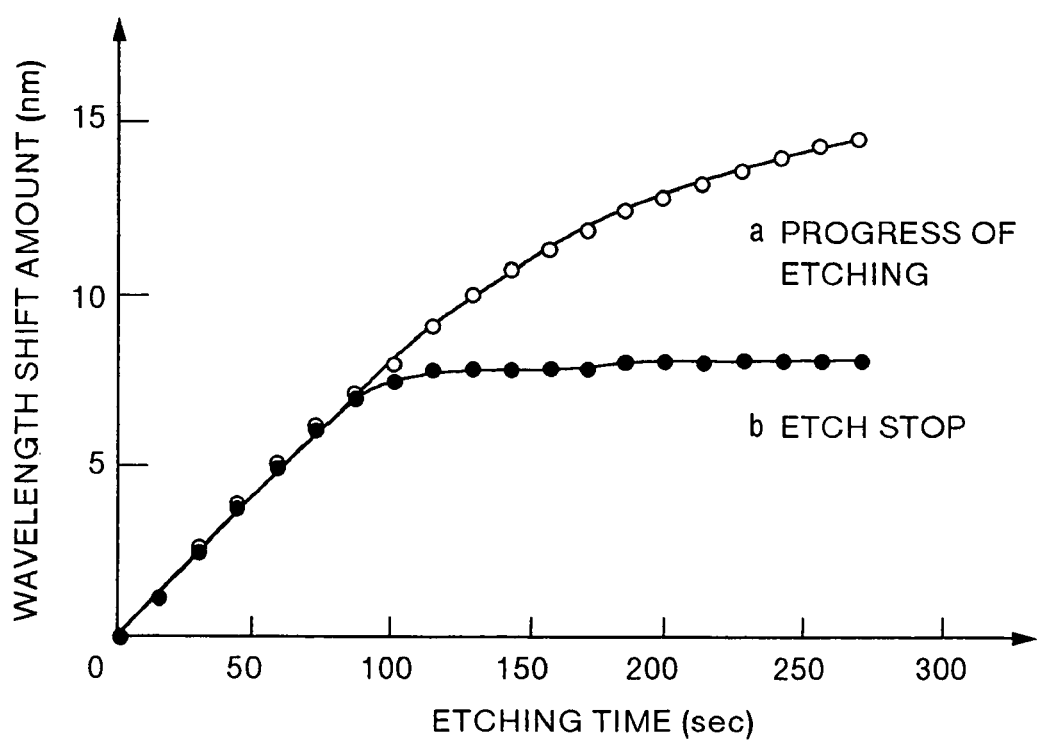
FIG. 6 is a characteristic diagram showing the relation between the wavelength shift amount of the interference peak and the etching time according to the first embodiment of the invention.
Figure 7:
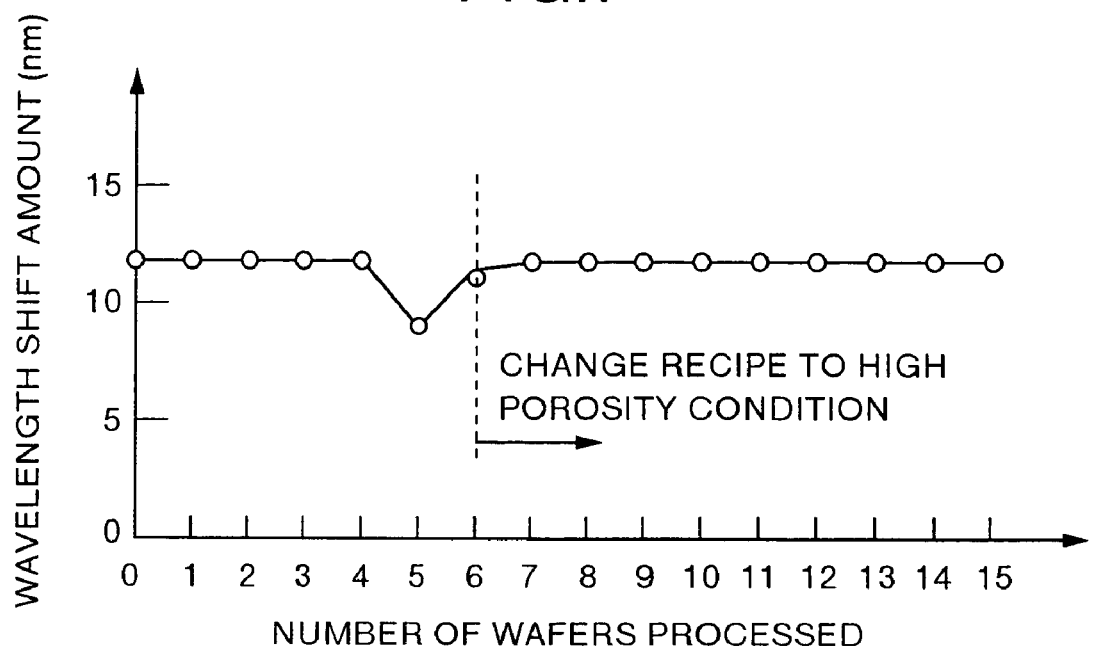
FIG. 7 is a characteristic diagram showing the relation between the wavelength shift amount and the number of wafers processed upon complete etching according to the first embodiment of the invention.

FIG. 6 shows the relation between the etching time and the wavelength shift amount. With the progress of the etching operation, as indicated by curve a, the wavelength shift amount increases with respect to the etching time. In the case where an etch stop occurs midway, however, the wavelength shift amount remains at a constant value from that time point as shown by curve b. According to this embodiment, in the case where the curve b is obtained during the etching operation, for example, it is determined that an etch stop has occurred, and as shown in FIG. 7, the process is continued by changing the recipe to high porosity conditions. As a result, the metal burial against the opening failure, i.e. the contact failure can be prevented. In this way, a system can be constructed in which while maintaining the throughput, the yield and productivity are improved.

This embodiment is explained above with reference to a system comprising the light source, the optical system and the detection system as a set. A similar effect is obtained, however, by dividing the detection light from the light source through an optical element such as a beam splitter and thus providing two sets of the light source, the optical system and the detection system. Further, the system can be used as a monitor of secular variations by measuring the reflectivity alone in the hole portion for each wafer.

Also, according to this embodiment, the configuration in which the etching depth is measured in real time was explained. This etching depth measuring unit can be installed without regard to the gas atmosphere. Specifically, the etching depth measuring unit can be installed not only in the vacuum chamber for conducting the etching operation, but also in an unload lock chamber 29 shown in FIG. 8, for example, where the wafer after etching is carried and stays for a certain length of time. As a result, the etching depth can be monitored without reducing the throughput. By monitoring the etching depth of the contact holes, the process is stopped for the semiconductor wafer next to be etched or the feedback to the etching process conditions is made possible.

After that, a metal such as tungsten (W) or copper (Cu) is buried in the through holes thus formed.

Embodiment 2

With reference to FIGS. 9 to 13, an embodiment in which the etching depth is observed by measuring the electrostatic capacitance is explained.

Figure 8:
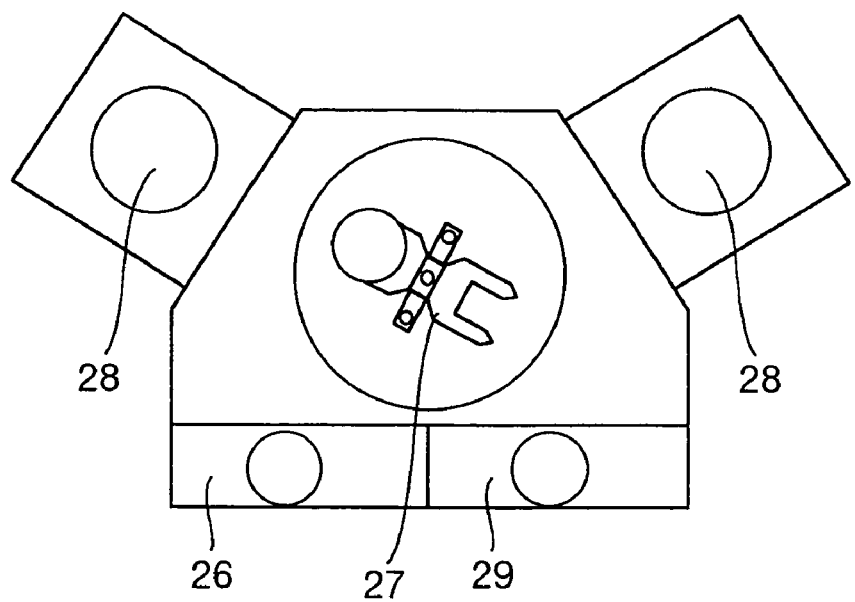
FIG. 8 is a schematic diagram showing a plasma etching system of multichamber type used in the first embodiment of the invention.

According to this embodiment, the measuring means is installed in the unload lock chamber or, for example, in the unload lock chamber 29 shown in FIG. 8. The unload lock chamber is an intermediate vacuum chamber for discharging the wafer processed in the etching chamber to the wafer cassette.

Figure 9:
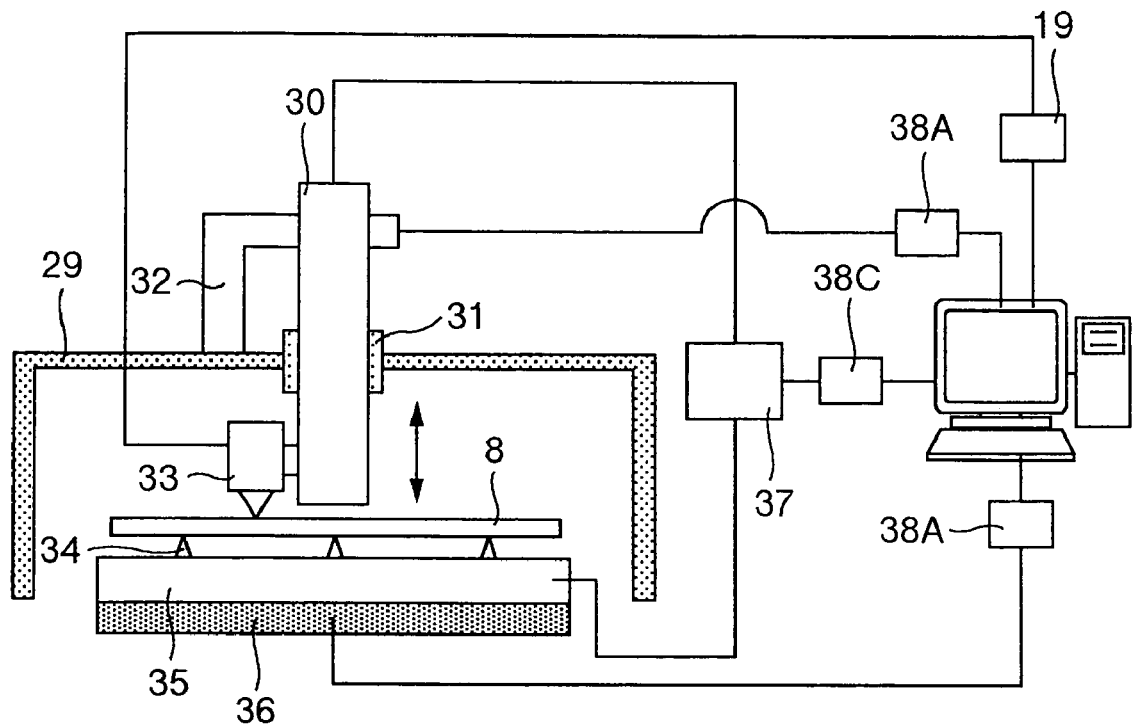
FIG. 9 is a schematic diagram showing an unload lock chamber with the etching depth inspection function used in the second embodiment of the invention.

In FIG. 9, a measuring upper electrode (second electrode) 30 is installed in opposed relation to the wafer surface in the ceiling portion of the unload lock chamber 29. This measuring upper electrode 30 is electrically isolated from the vacuum chamber by an insulating member 31. The end portion of an upper electrode 30 opposed to the wafer forms a circular flat surface of 0.1 mm to 3 mm in diameter. The upper electrode 30 is arranged on a vertically movable stage 32 in such a manner that the interval with the wafer surface is set to 0.1 μm to 50 μm. In order to monitor this interval, a laser displacement gauge 33 is mounted at the forward end of the electrode. A measuring lower electrode (first electrode) 35 with the wafer placed thereon, on the other hand, is arranged on an XY movable table 36 movable in both X and Y directions and can measure an arbitrary position. The XY movable table 36 is electrically connected to the computer 20 through an A/D converter 38A. The laser displacement gauge 33 is electrically connected to the computer 20 through an A/D converter 19. The lower electrode 35 includes a plurality of protruded electrodes 34 having a sharp forward end through the oxide film on the opposite surface of the wafer to assure constant contact. An impedance meter 37 is electrically connected between the upper electrode 30 and the lower electrode 35 to measure the capacitance between the electrodes. The impedance meter 37 is electrically connected to the computer 20 through the A/D converter 38C.

Next, the method of measuring the etching depth is explained.

First, as shown in FIG. 9, the wafer 8 after etching is transported and arranged on the lower electrode 35. Since the opposite surface of some wafers is formed with an oxide film, the contact is secured by applying the protruded electrodes against it. In this case, by measuring the resistance between two protrusions each time the wafer is arranged, the reproducibility of the contact on the reverse surface is guaranteed. Any means other than a small protruded electrode capable of securing contact positively, however, is of course covered by the scope of this embodiment.

Figure 10:
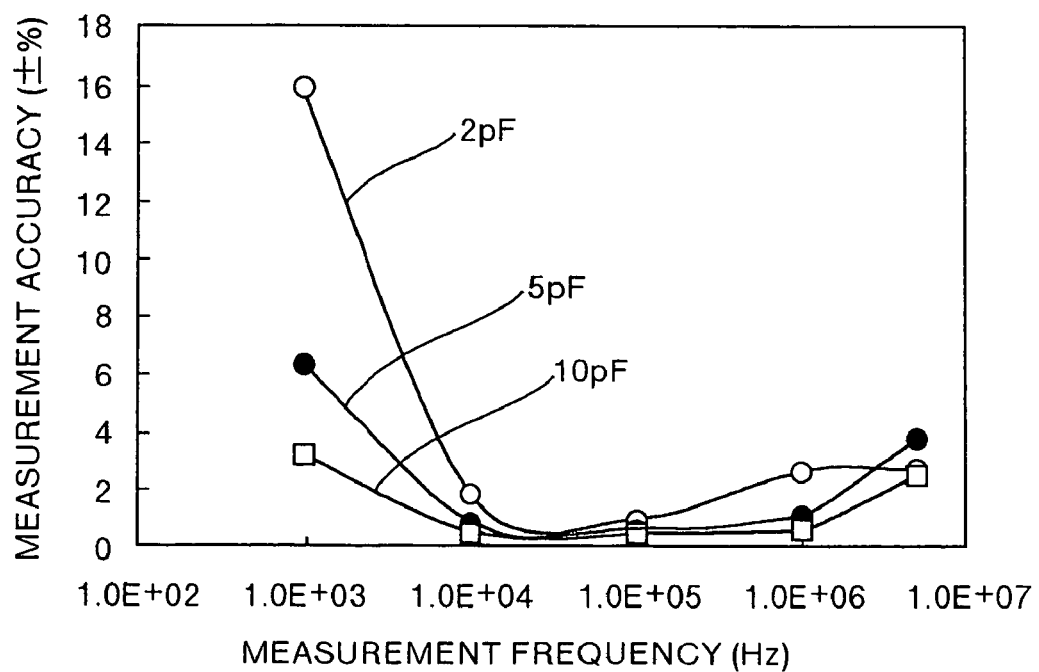
FIG. 10 is a characteristic diagram showing the relation between the measurement accuracy and the measurement frequency of the impedance measurement according to the second embodiment of the invention.

Next, based on the pattern data of the wafer stored in advance in the computer 20, the XY movable table 36 is driven so that the electrode 30 is moved to the measurement position of the flat portion having no pattern. After that, the output value of the laser displacement gauge 33 is fed back while driving the vertically movable stage 32 thereby to fix the interval between the surface of the wafer 8 and the surface of the upper electrode 30 at a set value. FIG. 10 shows the relation between the measurement accuracy of the impedance meter and the measurement frequency. According to this embodiment, the measurement frequency is set to 100 kHz to minimize the measurement accuracy.

Figure 11:
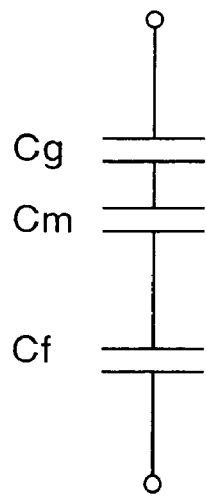
FIG. 11 is an equivalent circuit diagram showing the capacitance between the upper electrode and the lower electrode in the flat portion of the main wafer surface according to the second embodiment of the invention.

The impedance is measured at the measurement position on the flat portion. The measurement, as shown in FIG. 11, is equivalent to the combined capacitance of the capacitance Cg between the electrode and the wafer, the resist capacitance Cm and the oxide film capacitance Cf connected in series.

Figure 12:
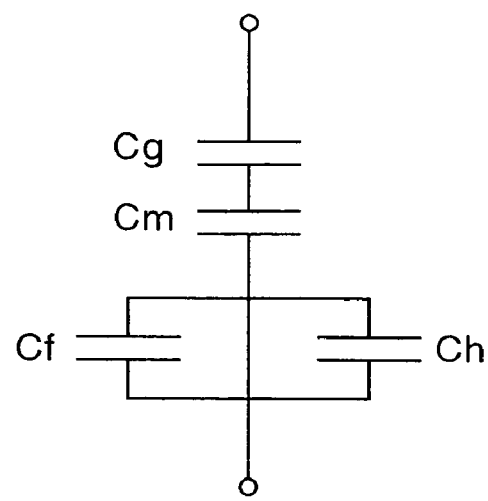
FIG. 12 is an equivalent circuit diagram showing the capacitance between the upper electrode and the lower electrode in the hole portion of the main wafer surface according to the second embodiment of the invention.
Figure 13:
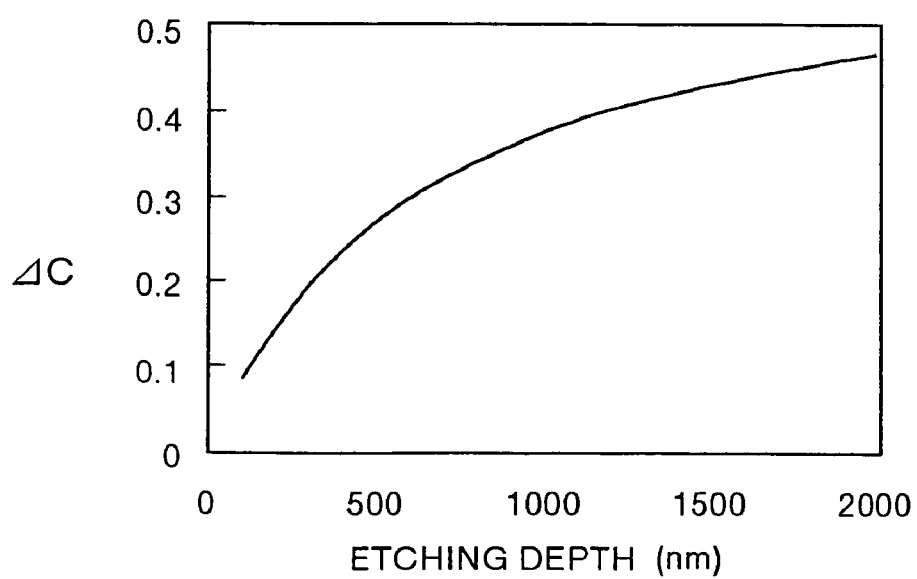
FIG. 13 is a characteristic diagram showing the relation between the etching depth and ΔC according to the second embodiment of the invention.

Next, the position of the upper electrode 30 is changed to the hole portion providing the measurement position by the XY movable table 36. As in the measurement on the flat portion, the combined capacitance is measured from the impedance measurement. As in the first embodiment, the holes formed by etching are assumed to become progressively porous macroscopically. As shown in FIG. 12, a parallel capacitance can be assumed between the capacitance Ch of the hole portion and the capacitance Cf' of the portion (around the hole portion) filled with the oxide film. Since the combined capacitance is reduced by etching, the relation between the difference ΔC with the value for the flat portion and the etching depth as shown in FIG. 13 is obtained. In this case, the thickness of the oxide film is assumed to be 2 μm, the open area ratio to be 20% and the electrode-wafer interval to be 1 μm. In this case, ΔC increases with the etching depth, and assumes 0.47 (pF) for the etching depth of 2 m. This is a value equal to about 5% of the combined capacitance and sufficiently measurable.

Next, the improvement of reproducibility of the measurement position is explained. As explained in the first embodiment, the XY movable table with the wafer arranged thereon is scanned in the neighborhood of the measurement position of the hole portion. At each position, the combined capacitance is measured, and the difference between the minimum of this value and the combined capacitance of the flat portion is assumed to be the true value of ΔC. With this process, even for a pattern having large pitches of the hole portions like a logic product, the number of holes accommodated in the measurement range of the upper electrode can be maintained at a constant and maximum value for each wafer, and therefore the measurement accuracy can be improved.

As long as the above-mentioned inspection shows that the through holes are formed positively by etching, such metal as tungsten (W) or copper (Cu) is buried in the through holes thus formed. In other words, the process of burying the metal in the through holes is executed. In the case where the through holes are an opening failure, the etching conditions for the next semiconductor wafer to be etched are changed to a recipe assuring positive opening.

Also in this embodiment, as in the first embodiment, the resist selectivity can be calculated. The combined capacitance for the flat portion obtained earlier is compared with the theoretical combined capacitance calculated from the wafer thickness structure stored in advance, so that the resist film thickness at the particular time point can be calculated. Thus, the difference with the initial film thickness gives the reduced resist amount after complete etching. As already explained, on the other hand, the etching depth is determined from the difference between the combined capacitance of the flat portion and the combined capacitance of the hole portion, the oxide film thickness, the opening area and the film structure between the electrode and the wafer. By dividing this value by the reduced resist amount, therefore, the resist selectivity can be determined.

Embodiment 3

Figure 17:
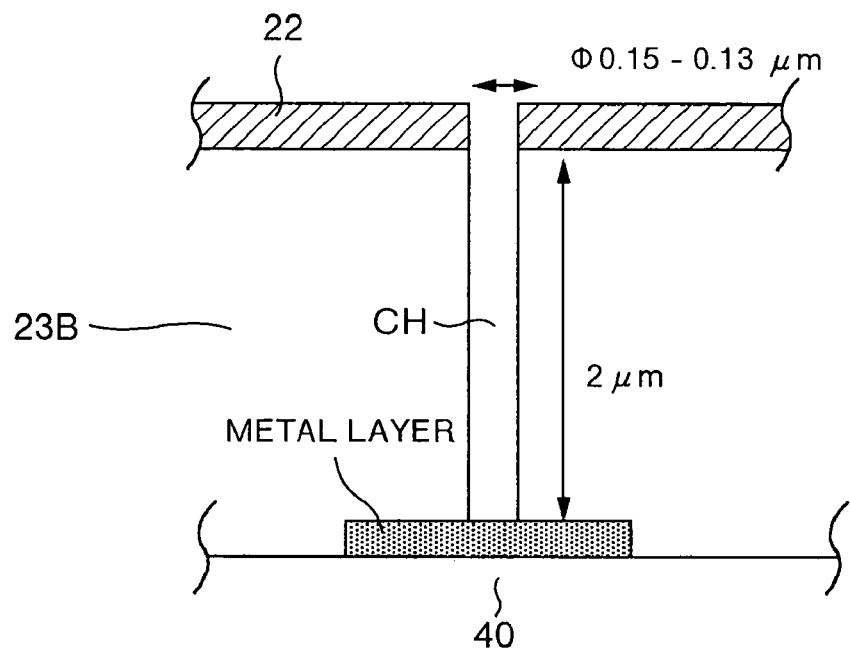
FIG. 17 is a partial sectional view showing a semiconductor device in the HARC forming step according to the third embodiment of the invention.
Figure 18:
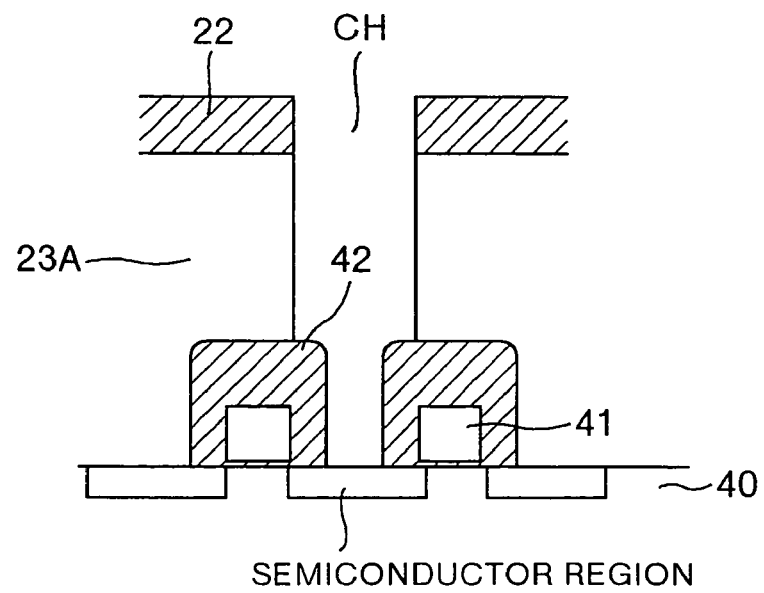
FIG. 18 is a partial sectional view showing a semiconductor device in the SAC forming step according to the third embodiment of the invention.

With reference to FIGS. 14 to 18, a more specific method of fabricating a semiconductor device according to an embodiment is explained below. The process of forming contact holes requiring a high-accuracy etching with the ever decreasing size of the semiconductor device (LSI) is shown in FIGS. 17 and 18.

First, FIG. 17 is a sectional view showing the process of forming contact holes called HARC (high aspect ratio contact hole) in the interlayer insulating film (specifically, the TEOS film). To form HARC, a hole as deep as 2 μm with a diameter of 0.13 μm or, in the future, not more than 0.1 μm is required to be formed in the interlayer insulating film 23B. In the process, the dry etching process causes an opening failure or a contact failure due to improper shape such as a tape in the hole bottom often leading to a lower yield.

FIG. 18 is a sectional view showing the process of forming contact holes called SAC (self-align contact). In forming SAC, a silicon nitride film 42 protecting a gate electrode 41 is not etched, but the silicon oxide film 23A is dry etched thereby to expose the main surface of a silicon substrate (more specifically, the semiconductor region such the source or drain) 40. To obtain the selectivity of the silicon nitride film 42 and the silicon oxide film 23, a sophisticate deposit control operation is required. Delicate variations of the etching conditions would cause an opening failure or the unsatisfactory shape such as a taper of the contact portion.

The method of evaluating the etching result described in the first or second embodiment is used for the process of forming the contact holes shown in FIG. 17 or 18.

Figure 14:
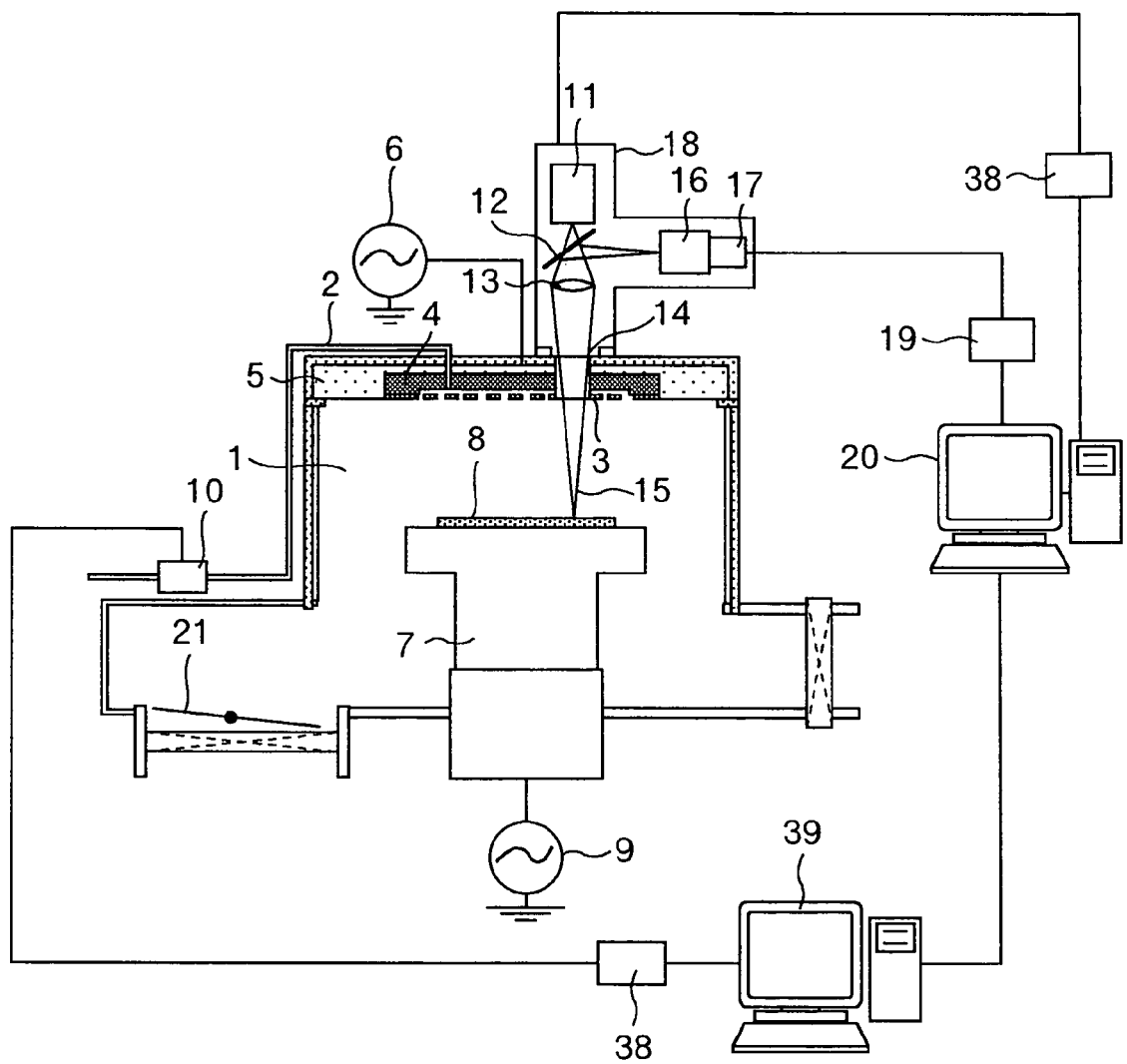
FIG. 14 is a schematic diagram showing a dry etching device with the etching depth inspection function used in a third embodiment of the invention.
Figure 15:
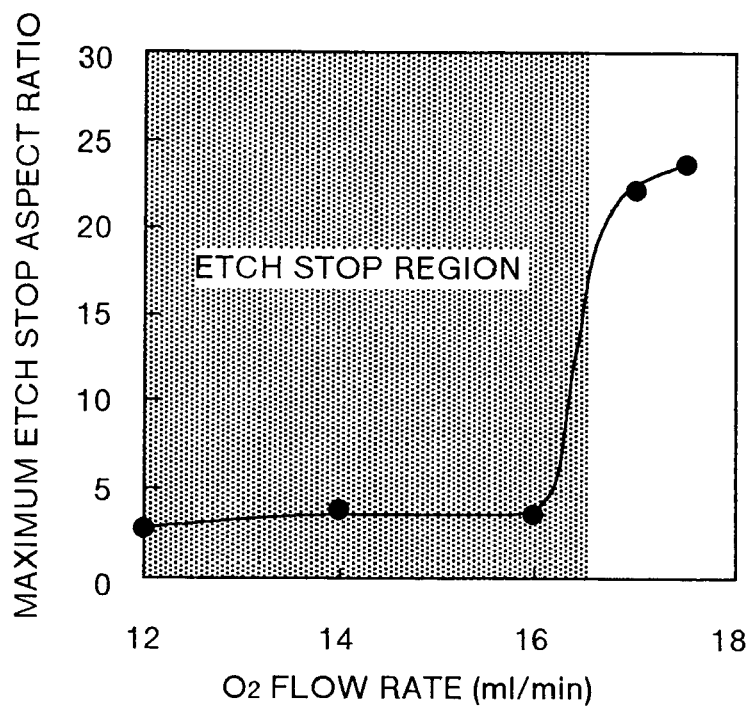
FIG. 15 is a characteristic diagram showing the relation between the added $O_2$ flow rate and the maximum aspect ratio generated by an etch stop according to the third embodiment of the invention.
Figure 16:
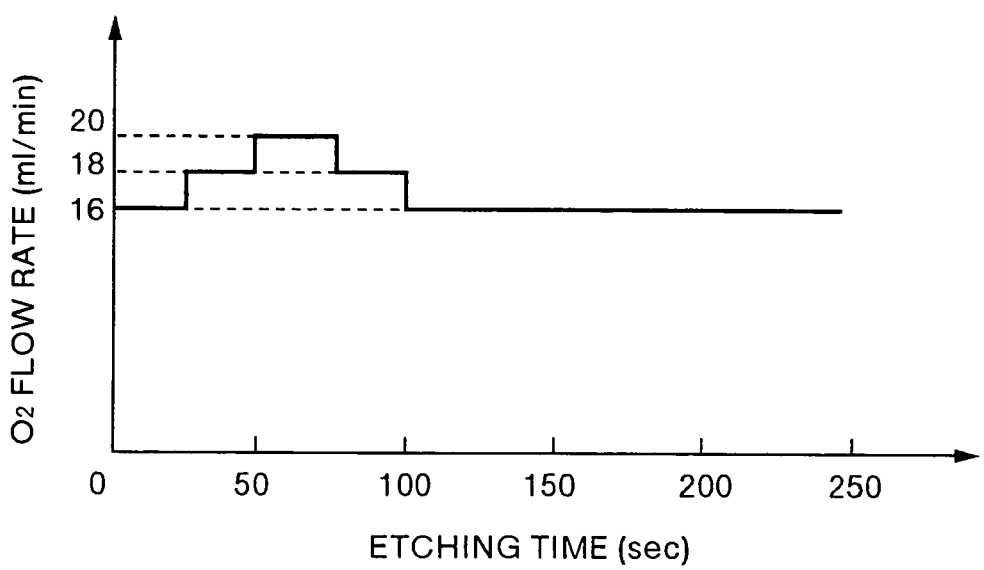
FIG. 16 is a sequence diagram showing the $O_2$ flow rate control step according to the third embodiment of the invention.

These processes of forming contact holes also employ the etching device shown in FIG. 14. An embodiment thereof is explained below.

An $Ar/C_5F_8/O_2$ mixed gas is used as a material gas, and the gas pressure is set to 2 Pa. Under this condition, assume that a minuscule hole (contact hole CH) having a diameter of 0.1 μm shown in FIG. 17 is etched. The flow rate of $O_3$ added and the maximum aspect ratio causing an etch stop hold the relation shown in FIG. 15. As a result, it is understood that the etch stop is remarkably improved with the $O_2$ flow rate and the region for suppressing the etching exists in the neighborhood of the aspect ratio 4. Specifically, it has become clear that to suppress the additional $O_2$ flow rate to required minimum and thus improve the mask selectivity, the stepped etching operation is effective in which the $O_2$ flow rate is increased to about 4 in aspect ratio and subsequently is reduced.

According to this embodiment, as shown in FIG. 14, the basic configuration is explained above in the first embodiment with reference to FIG. 1. Especially, to control the $O_2$ flow rate, the gas flowmeter 10 is electrically connected to a recipe control computer 39 through an A/D converter 38. According to this embodiment, the etching is conducted at the $O_2$ flow rate control step shown in FIG. 16. The relation between the aspect ratio and the $O_2$ flow rate added is input beforehand in the recipe control computer 39. In this way, the problem described above can be obviated without regard to the change in etching rate due to secular variations. Although only the gas flow rate control system is described above, this control system is also applicable to the control operation of other external parameters including the gas pressure, high-frequency power and high-frequency bias power.

After the step of forming contact holes, what is called the plug forming step is executed in which a metal is buried in the contact holes CH. After the plug forming step, the wiring forming step is executed by the well-known sputtering or photolithography.

Incidentally, in the process of fabricating the semiconductor device, the SAC forming step shown in FIG. 18 is executed before the HARC forming step shown in FIG. 17. The HARC forming step shown in FIG. 18 is executed on the insulating film 23B formed on the interlayer insulating film 23A shown in FIG. 18.

According to this invention explained specifically above with reference to embodiments, in the etching method to form contact holes by etching, the mask selectivity of the resist or the like and the etching depth are monitored nondestructively and simplified way in the etching process or in the process of transporting the wafer from the etching chamber after complete etching, thereby making an early lot stop or feedback to the process conditions. As a result, the productivity can be improved in the production of DRAM or the like products requiring the small-volume-multi-item production as well as the large-volume-scant-item production required for logic products.

INDUSTRIAL APPLICABILITY

According to this invention, in the process of fabricating a semiconductor device or especially in the step of forming contact holes, the etching depth and the mask selectivity of the resist or the like can be monitored and feedback is made possible nondestructively in simple method during the etching process or during the wafer transportation from the etching chamber after the etching process. As a result, the yield and productivity of the semiconductor device are improved.

The invention claimed is:

1. A method of fabricating a semiconductor device, using a plasma etching system including a vacuum chamber, a susceptor arranged in the vacuum chamber for mounting a semiconductor wafer, a gas introducing means for introducing a gas to the vacuum chamber and a means for introducing high-frequency power, the method comprising the steps of:

producing plasma from the gas introduced into the vacuum chamber using the high-frequency power;
forming a plurality of holes selectively on a surface of the semiconductor wafer in an atmosphere of the plasma;
irradiating light having a continuous spectrum in a flat portion and a hole portion of the surface of the semiconductor wafer;
measuring a relation between a first reflectivity of the light and a first wavelength of the light for the flat portion, and a relation between a second reflectivity of the light and a second wavelength of the light for the hole portion respectively;
measuring the amount of shift between the first reflectivity for the flat portion and the second reflectivity for the hole portion with respect to the first and second wavelengths; and
calculating the depth of the hole portion based on the shift amount of the first and second reflectivity with respect to the first and second wavelength, film thickness data and hole pattern data.

2. A method for fabricating a semiconductor device as defined in claim 1, wherein the light enters the surface of the semiconductor wafer at right angles or diagonally thereto, and the first and second reflectivity is measured from the ratio of intensity between the incident light and the reflected light.

3. A method for fabricating a semiconductor device as defined in claim 1, wherein the surface of the semiconductor wafer has an interlayer insulating film, and the plurality of the holes are formed in the interlayer insulating film.

4. A method of fabricating a semiconductor device comprising:

(1) a step of forming an insulating film on the semiconductor substrate and a mask on the insulating film, the mask having a hole portion formed with a plurality of hole patterns and a flat portion not formed with a hole pattern;
(2) a step of forming a plurality of holes in the insulating film by dry etching based on the mask;
(3) a step of irradiating light having a continuous spectrum on a flat portion and a hole portion of the film, measuring a shift amount between a first reflectivity of the light with respect to a first wavelength of the light in the flat portion and a second reflectivity of the light with respect to a second wavelength of the light in the hole portion respectively and calculating the depth of the hole portion based on the measurement result thereby to control the operation to form a plurality of holes through the insulating film during the step of (2); and
(4) a step of burying a metal in the plurality of the holes of the hole portion.

5. A method for fabricating a semiconductor device as defined in claim 4, wherein:

the light enters a surface of a semiconductor wafer at right angles or diagonally thereto, and the first and second reflectivity is measured from the ratio of intensity between the incident light and the reflected light during the step (2).

6. A method for fabricating a semiconductor device as defined in claim 4, wherein the light is incident on a surface of a semiconductor wafer at right angles or diagonally thereto, and the first and second reflectivity thereby is measured from the ratio of intensity between the incident light and its reflected light during the step (2).

7. A method for fabricating a semiconductor device as defined in claim 6, wherein the light is white light.

8. A method for fabricating a semiconductor device by preparing a plasma etching system including a vacuum chamber, a susceptor arranged in the vacuum chamber for installing a semiconductor wafer, a gas introducing means for introducing the gas to the vacuum chamber and a high-frequency power introducing means, the method comprising the steps of:

converting the gas to a plasma introduced into the vacuum chamber and forming a plurality of holes selectively on a surface of the semiconductor wafer in a plasma atmosphere, further preparing the plasma etching system by including a light source for radiating detection light, a detection system having a beam splitter arranged in a light path, a lens, a spectrometer and a diode array, an XY movable table movable in horizontal direction in the detection system and a computer for storing data of the detection system, and the detection light from the light source being radiated on the surface of the semiconductor wafer through a quartz window formed in a ceiling portion of the vacuum chamber; and the method further comprising a step of radiating the detection light from the light source in a flat portion and a hole portion of the surface of the semiconductor wafer; and measuring the change reflectivity with respect to wavelength between the flat portion and the hole portion, and calculating the depth of the hole portion based on the shift amount of the reflectivity with respect to the wavelength, film thickness data and hole pattern data.

9. A method for fabricating a semiconductor device by preparing a plasma etching system including a vacuum chamber, a gas introducing means for introducing a gas to the vacuum chamber and a high-frequency power introducing means, the method comprising the step of converting, by the high-frequency power, to a plasma the gas introduced into the vacuum chamber by the gas introducing means and forming a plurality of holes selectively on a main surface of a semiconductor wafer in a plasma atmosphere, wherein:

the plasma etching system includes an etching depth inspection unit having a first electrode arranged in contact with the semiconductor wafer and movable in a horizontal direction, a second electrode arranged in opposed relation to first electrode and movable in a vertical direction, an impedance meter electrically connected to first and second electrodes, and a computer electrically connected to the impedance meter through an A/D converter;

the method comprising a step of measuring an electrostatic capacitance of a flat portion and a hole portion of the wafer on the main surface of the semiconductor wafer by the etching depth inspection unit after forming the holes, and a step of comparing the electrostatic capacitance acquired from the flat portion and the hole portion with each other and determining the difference between a measurement value of the electrostatic capacitance of the flat portion and a measurement value of the electrostatic capacitance of the hole portion;

further comprising a step of scanning the semiconductor wafer by the second electrode for measuring the hole portion, a scanning step determining the position of the second electrode in such a manner as to minimize the electrostatic capacitance.

10. A method for fabricating a semiconductor device as defined in claim 9, wherein the plasma etching system includes a load lock chamber and an unload lock chamber, and the first and second electrodes are arranged in the unload lock chamber.

11. A method for fabricating a semiconductor device as defined in claim 9, wherein a plurality of protruded electrodes in contact with the reverse surface of the semiconductor wafer are arranged on the first electrode.

12. An apparatus for fabricating a semiconductor device as defined in claim 9, wherein the forward end portion of the second electrode constitutes a circular surface having a diameter of 0.1 mm to 3 mm.

13. A method for fabricating a semiconductor device as defined in claim 9, wherein the interval between the second electrode and the surface of the semiconductor wafer is between 0.1 μm and 50 μm.

* * * * *